United States Patent [19]
Fujita et al.
[11] 3,728,641
[45] Apr. 17, 1973

[54] VARIABLE TEMPERATURE COMPENSATING CAPACITOR FOR CRYSTAL OSCILLATORS

[75] Inventors: Kinji Fujita; Hiromitsu Mitsui, both of Nagano, Japan

[73] Assignee: Kabushiki Kaisha Suwa Seikosha, Tokyo, Japan

[22] Filed: Aug. 3, 1971

[21] Appl. No.: 168,656

[30] Foreign Application Priority Data

Aug. 6, 1970 Japan ................................45/68321
Aug. 6, 1970 Japan ................................45/68322

[52] U.S. Cl.................331/116 R, 317/248, 317/253, 317/258, 331/176
[51] Int. Cl.................................................H03b 5/30
[58] Field of Search......................317/247, 248, 253, 317/258; 331/116 R, 176

[56] References Cited

UNITED STATES PATENTS

| | | | |
|---|---|---|---|
| 2,591,792 | 4/1952 | Donley | 317/248 |
| 3,289,055 | 11/1966 | Aizawa et al. | 331/176 |
| 3,404,298 | 10/1968 | Roberts | 331/176 |
| 3,581,236 | 5/1971 | Berman | 331/116 |

*Primary Examiner*—John Kominski
*Attorney*—Alex Friedman et al.

[57] ABSTRACT

A temperature sensitive capacitor having a dielectric such as $BaTiO_3$, wherein capacitance varies in response to temperature, is provided with means for manually changing the capacitance thereof either in a stepwise manner or continuously.

6 Claims, 8 Drawing Figures

PRIOR ART FIG. 1
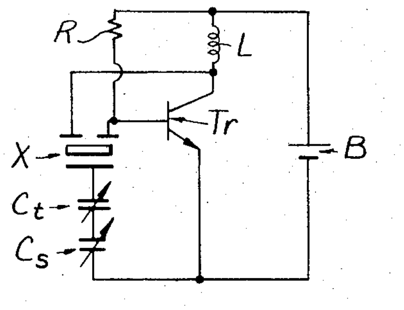
FIG. 2
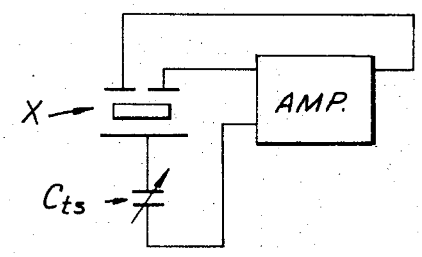
FIG. 3a
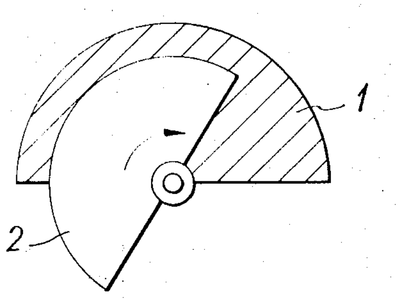
FIG. 3b
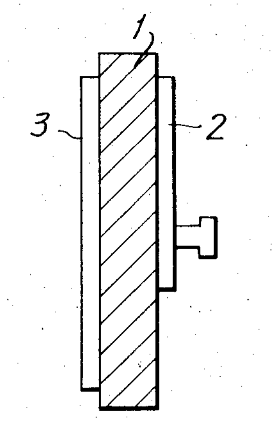
INVENTORS.
KINJI FUJITA
HIROMITSU MITSUI
BY
Blum, Moscovitz, Friedman & Kaplan
ATTORNEYS PRIOR ART FIG. 4
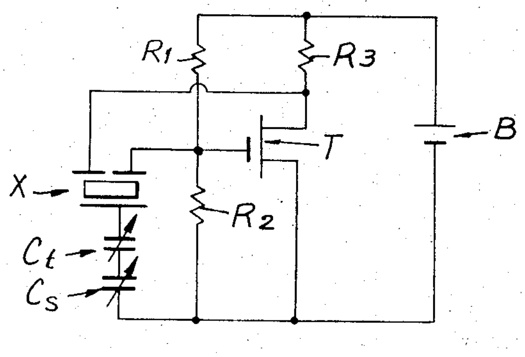
FIG. 5
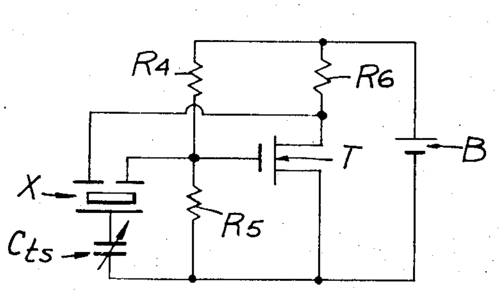
INVENTORS.
KINJI FUJITA
HIROMITSU MITSUI
BY
Blum, Moscovitz, Friedman & Kaplan
ATTORNEYS INVENTORS.
KINJI FUJITA
HIROMITSU MITSUI
BY
Blum, Moscovitz, Friedman & Kaplan
ATTORNEYS

VARIABLE TEMPERATURE COMPENSATING CAPACITOR FOR CRYSTAL OSCILLATORS

BACKGROUND OF THE INVENTION

This invention relates to crystal oscillators wherein it is necessary to compensate the oscillation frequency for variation due to temperature changes, and in particular, to temperature sensitive capacitors for this purpose.

In a conventional type of crystal oscillator, a temperature compensating element is connected in series with the crystal oscillator, the element utilizing a thermistor or variable capacitor wherein the resistance value is changed in response to temperature. Such elements are usually formed independent of the other components of the circuitry and hermetically sealed. In order to reduce expense and space, it is desirable to combine this element with other elements in the circuit, particularly where the circuit is to be applied to electric timepieces.

SUMMARY OF THE INVENTION

Generally speaking, in accordance with the invention, a crystal oscillator is provided having a temperature compensating condenser having a dielectric such $BaTiO_3$ connected in series with a crystal vibrator, the condenser being adapted to so that the capacitance thereof changes in response to temperature in accordance with both positive and negative temperature coefficients. Means are provided for manually adjusting the capacitance of said temperature compensating condenser. Said means may include rotor means defining one plate of said capacitor and pivotably mounted on one side of the dielectric, a fixed capacitor plate being mounted on the other side thereof. The capacitance of said condenser is adjusted by rotating the rotor so as to selectively control the area of said rotor opposite said fixed condenser plate.

In another embodiment of the condenser according to the invention, one of said condenser plates is segmented, and means are provided for selectively connecting one or more of said segments in the circuit. Said connecting means may include a displaceable contact for engaging only one of said segments, in which the case the area of each of said segments is preferably different from the area of the other of said segments, or said contacting means may include a displaceable contact sequentially engageable with additional segments of the condenser plate in response to the rotation thereof.

Accordingly, the object of the invention is to provide a very compact crystal oscillator circuit wherein additional electric power is not required for temperature compensation.

Another object of the invention is to provide a quartz crystal wrist watch incorporating a temperature compensating element of simplified construction and design, which is readily incorporated within a limited space, and is of increased reliability.

DESCRIPTION OF THE PREFERRED EMBODIMENTS

Figure 6A:
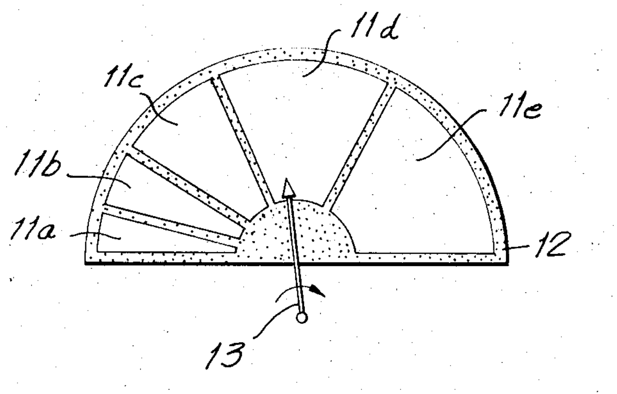

Referring now to FIG. 1, a conventional crystal oscillator circuit is depicted, wherein a temperature compensating element $C_t$ is connected in series with a crystal oscillator X for compensating frequency in response to temperature changes. A variable condenser $C_s$ is connected in series with element $C_t$ for regulating the frequency of the crystal oscillator to the desired frequency for operating the satch in which the circuit is connected. The circuit is completed by a transistor Tr, a battery B, a base resistor R, and a load inductance L. Transistor *Tr* is connected with its emitter-collector path in series with inductance L, said series combination being connected across battery B. One terminal of oscillator X is connected both to the base of said transistor and, to resistor R, to the common connection of battery B and inductance L. Another terminal of said oscillator is connected to the intersection between the collector of the transistor and inductance L, the emitter of said transistor being connected to variable condenser $C_s$. A similar prior art circuit is shown in FIG. 4, utilizing a MOSFET T as the switching element. Resistors $R_1$, $R_2$ and $R_3$ complete the circuit which includes the crystal oscillator X, battery B, temperature compensating element $C_t$ and variable condenser $C_s$. The source-drain path of MOSFET T is connected in series with resistor $R_3$ across battery B. One terminal os oscillator X is connected to the intersection between said source-drain path and resistor $R_3$, a second terminal is connected to the intersection of resistors $R_1$ and $R_2$ and the gate of said MOSFET T, while the third terminal of said oscillator is connected through the series connection of temperature compensating element $C_t$ and variable condenser $C_s$ to the intersection of resistor $R_2$, the source-drain path MOSFET T and battery B. Resistor $R_1$ is connected to the intersection of resistor $R_3$ and battery B. FIG. 2 shows a partial block diagram showing the circuit according to the invention, wherein a manually variable temperature compensating condenser $C_{ts}$ is connected in series with a crystal oscillator X. Condenser $C_{ts}$ serves both to compensate for variations in temperature and for the regulation of the rate of the watch by regulating the frequency of the oscillator. Condenser $C_{ts}$ is connected between one terminal of oscillator X and an amplifier AMP. Said amplifier drives the crystal oscillator and is connected to the other two terminals thereof. FIG. 5 shows the arrangement according to the invention connected to an amplifier circuit incorporating a MOSFET T, similar to the circuitry of FIG. 4. In the circuit of FIG. 5, resistors $R_4$, $R_5$ and $R_6$ correspond respectively to resistors $R_1$, $R_2$ and $R_3$, while condenser $C_{ts}$ replaces the series combination of compensating elements $C_t$ and variable condenser $C_s$.

In the embodiments of FIGS. 2 and 5, condenser $C_{ts}$ has a dielectric formed of a ferroelectric substance such as ceramics of $BaTiO_3$, which serves as the temperature compensating element. This material is the ferroelectric substance obtained by mixing barium or strontium. If the ratio of the components of the dielectric are changed, then the curie point of the material also changes. The temperature coefficient of the $BaTiO_3$ dielectric varies positively or negatively relative to said curie point. Thus, when the temperature becomes higher than said curie point, the dielectric has a negative characteristic. If the ambient temperature changes from a low temperature to the temperature of the curie point, the capacitance of the dielectric is increased, while if the ambient temperature exceeds the curie point the capacitance is decreased.

The performance of the ferroelectric dielectric varies markedly when the temperature exceeds the curie point, and it is difficult to regain the original performance characteristics. If the temperature is increased from low to high, and then reduced from high to low, the dielectric constant cannot be returned to the initial value, but rather, follows a hysteresis path. However, it was found that after various experiments, including forced aging by the frequent cycling of temperature in a range twice as large as the range of operating temperature actually experienced in wrist watches, namely minus 20° C to plus 80° C, it was found that the ferroelectric substance according to the invention can be used for oscillators for wrist watches according to the invention.

In general, the temperature characteristics of a crystal oscillator follows the path of a parabola. Generally, the temperature characteristics of the crystal oscillator are fixed at about 20° C, since the temperature coefficient is zero at that peak point, and the temperature constant of the frequency is a minimum. Accordingly, the temperature compensating element would also be fixed at 20° C. Material having a curie point near the normal temperature can maintain the original frequency characteristics of the circuit even if the range of ambient temperature increases higher than the curie point, so that there is no difficulty in the practical application of the arrangement according to the invention.

Referring now to FIGS. 3a and 3b, one embodiment of the manually varied temperature compensating element according to the invention is depicted. The dielectric 1 is formed of $BaTiO_3$, and has a metal rotor 2 pivotably mounted on one side thereof, and a back electrode 3 fixedly mounted on the other side thereof. The capacitance is determined by the overlapping area between rotor 2 and fixed back electrode 3, so that if rotor 2 is rotated, the capacitance can be selectively set at the desired value along a continuous range. By selecting the shape of rotor 1, the precise desired characteristics of variation of capacity with rotational angle of the rotor can be achieved.

A second embodiment of the arrangement according to the invention is shown in FIG. 6a, wherein a segmented electrode, consisting of segments 11a, 11b, 11c, 11d and 11e are secured to the surface of the dielectric 12. The areas of each of said segments are different in size, and a displaceable terminal 13 is provided for selecting one of said electrode segments. A fixed electrode could be mounted on the other side of dielectric 12.

Figure 6B:
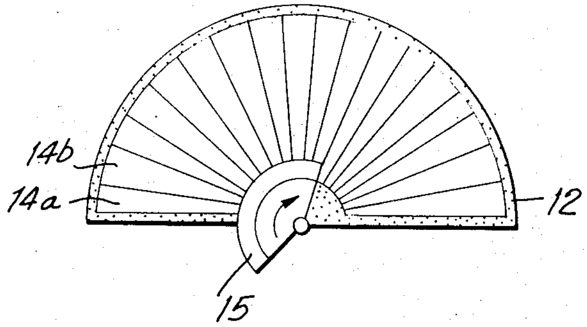

In the embodiment of FIG. 6b, the segments 14a, 14b, ..., are of substantially equal area, and are short circuited by the rotation of a rotor 15 to selectively short circuit one or more of said electrode segments together to define the capacitance of the condenser. The electrodes may be formed of silver fired onto the sintered dielectric material, such as $BaTiO_3$. The best capacitive results are obtained where the electrodes are fired on the sintered material. In the embodiments of FIGS. 6a and 6b, capacitance is not changed continuously, but rather, is changed in a step-wise manner. However, the incremental steps can be made extremely small, so that the appearance of continuous variation is created.

The arrangement according to the invention is particularly useful where space is limited, such as in a quartz crystal wrist watch, and is particularly adapted for use in compact-size crystal oscillators wherein temperatures to be compensated for.

It will thus be seen that the objects set forth above, and those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In a crystal oscillator having a crystal vibrator and wherein the oscillating frequency varies in accordance with temperature, the improvement which comprises a single manually variable temperature compensating ferroelectric condenser having a pair of output terminals; a temperature compensating ferroelectric dielectric; a fixed electrode plate mounted on one side of said dielectric and coupled to one of said output terminals; and manually adjustable means including electrode means mounted on the other side of said dielectric in facing relation to said fixed plate and coupled to the other of said output terminals for manually varying the capacitance of said condenser by manually selecting the area of said dielectric between saie fixed plate and electrode means in the circuit between said output terminals.

2. A crystal oscillator as recited in claim 10, wherein said manually adjustable means includes a displaceable plate defining said electrode means mounted on said other side of said dielectric, and means for manually displacing said displaceable plate for varying the overlapping areas between said fixed and displaceable plates, and therefor the capacitance of said condenser.

3. A crystal oscillator as recited in claim 11, wherein said means for manually displacing said displaceable plate includes a rotor pivotably mounted on said dielectric.

4. A crystal oscillator as recited in claim 1, wherein said manually adjustable means includes a segmented plate fixed to said other side of said dielectric and defining said electrode means and displaceable contact means for selectively engaging one or more of said plate segments to electrically connect said plate segments to the other of said output terminals.

5. A crystal oscillator as recited in claim 4, wherein the segments defining said segmented electrode are each of a different area, said displaceable contact means being selectively engageable against any onf of said segments.

6. A crystal oscillator as recited in claim 4, wherin said segmented plate includes a plurality of segments, said displaceable electrode being positioned for selectively and sequentially electrically connecting respective segments of said segmented plate together for a step-wise adjustment of capacitance of said condenser.

* * * * *